United States Patent
Huang et al.

(10) Patent No.: US 8,671,531 B2
(45) Date of Patent: Mar. 18, 2014

(54) MANUFACTURING METHOD FOR A ZINC OXIDE PIEZOELECTRIC THIN-FILM WITH HIGH C-AXIS ORIENTATION

(75) Inventors: I-Yu Huang, Kaohsiung (TW);
Chang-Yu Lin, Kaohsiung (TW);
Yu-Hung Chen, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 724 days.

(21) Appl. No.: 12/913,818

(22) Filed: Oct. 28, 2010

(65) Prior Publication Data
US 2012/0023719 A1    Feb. 2, 2012

(30) Foreign Application Priority Data
Jul. 28, 2010  (TW) .............................. 99124999 A (51) Int. Cl.
*H01L 41/22*  (2013.01)
*H01L 41/18*  (2006.01)

(52) U.S. Cl.
USPC ............... 29/25.35; 29/846; 29/847; 216/42; 216/47; 310/348; 310/365

(58) Field of Classification Search
USPC ............. 29/25.35, 594, 846, 847; 216/42, 47, 216/54; 310/324, 348, 365
See application file for complete search history.

(56) References Cited

U.S. PATENT DOCUMENTS

| | | | |
|---|---|---|---|
| 4,672,354 A | * | 6/1987 | Kurtz et al. ............... 29/25.35 X |
| 6,345,424 B1 | * | 2/2002 | Hasegawa et al. ........... 29/25.35 |

FOREIGN PATENT DOCUMENTS

JP          06097760 A  *  4/1994  .................. 29/25.35

* cited by examiner

*Primary Examiner* — A. Dexter Tugbang
(74) *Attorney, Agent, or Firm* — Jackson IPG PLLC (57) ABSTRACT

A manufacturing method for a Zinc Oxide (ZnO) piezoelectric thin-film with high C-axis orientation comprises the steps of providing a substrate having a base, a $SiO_2$ layer and a $Si_3N_4$ layer; forming a bottom electrode layer on the $Si_3N_4$ layer; patterning the bottom electrode layer; sputtering a Zinc Oxide layer on the $Si_3N_4$ layer and the bottom electrode layer; forming a photoresist layer on the $Si_3N_4$ layer and the Zinc Oxide layer; patterning the photoresist to reveal the Zinc Oxide layer; forming a top electrode layer on the Zinc Oxide layer and the photoresist layer; removing the photoresist layer and the top electrode layer formed on the photoresist layer, and the top electrode layer formed on the Zinc Oxide layer can be remained; and patterning the $Si_3N_4$ layer to form a recess that reveals the base of the substrate.

12 Claims, 14 Drawing Sheets

United States Patent US 8,671,531 B2

MANUFACTURING METHOD FOR A ZINC OXIDE PIEZOELECTRIC THIN-FILM WITH HIGH C-AXIS ORIENTATION

FIELD OF THE INVENTION

The present invention is generally relating to a piezoelectric thin-film, more particularly to a Zinc Oxide piezoelectric thin-film with high C-axis orientation.

BACKGROUND OF THE INVENTION

A conventional piezoelectric thin-film is utilized to regard as sensing device by theory of acoustic resonance, wherein quartz crystal microbalance (QCM) has been utilized extensively in the field of piezoelectric sensor. Quartz crystal microbalance technology detects a mass by change in resonant frequency of a quartz crystal. The resonant frequency of the quartz crystal drops when a sampling object is absorbed on an electrode surface of the quartz crystal. By obtaining a resonant frequency offset from the quartz crystal and quantity of the molecules from the sampling object, the quantity of the molecules absorbed by the quartz crystal is able to require. The QCM technology has good linearity and is insensitive to temperature. However, QCM technology is not compatible with IC manufacturing process. Besides, the resonant frequency offset possesses only several kHz so that the application field is limited.

SUMMARY

A primary object of the present invention is to offer a manufacturing method for a Zinc Oxide (ZnO) piezoelectric thin-film with high C-axis orientation comprising: providing a substrate having a base, a $SiO_2$ layer and a $Si_3N_4$ layer; forming a bottom electrode layer on the $Si_3N_4$ layer; patterning the bottom electrode layer; sputtering a Zinc Oxide layer on the $Si_3N_4$ layer and the bottom electrode layer, parameters for sputtering the Zinc Oxide layer include substrate temperature, oxygen/argon ratio, sputtering power and base pressure, wherein substrate temperature is within the range from 250 to 350 degrees, oxygen/argon ratio is within the range from 20% to 25%, sputtering power is within the range from 150 to 250 watts and base pressure is within the range from $5 \times 10^{-6}$ to $7 \times 10^{-6}$ Torr; patterning the Zinc Oxide layer; forming a photoresist layer on the $Si_3N_4$ layer and the Zinc Oxide layer; patterning the photoresist layer to reveal the Zinc Oxide layer; forming a top electrode layer on the Zinc Oxide layer and the photoresist layer; removing the photoresist layer and the top electrode layer formed on the photoresist layer, and the top electrode layer formed on the Zinc Oxide layer can be remained; patterning the $Si_3N_4$ layer to form a recess that reveals the base of the substrate. In this invention, via introducing mentioned sputtering parameters, the Zinc Oxide piezoelectric thin-film quality can be effectively improved. Besides, the diffraction intensity of the Zinc Oxide piezoelectric thin-film is higher than 20000 (A. U.).

DETAILED DESCRIPTION OF THE INVENTION

Figure 1A:
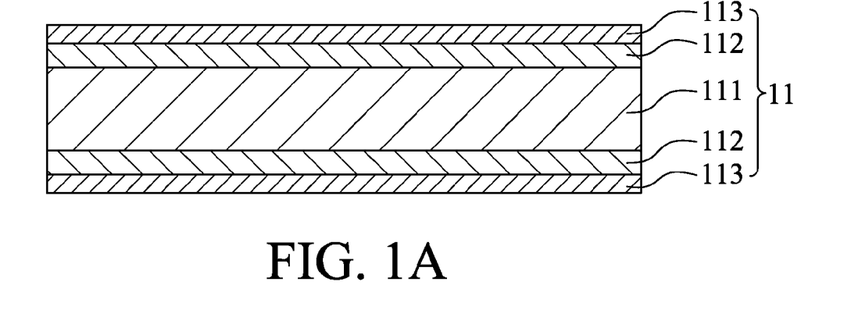
FIG. 1A-1J is a manufacturing flow for a Zinc Oxide piezoelectric thin-film with high C-axis orientation in accordance with an embodiment of the present invention.
Figure 1B:
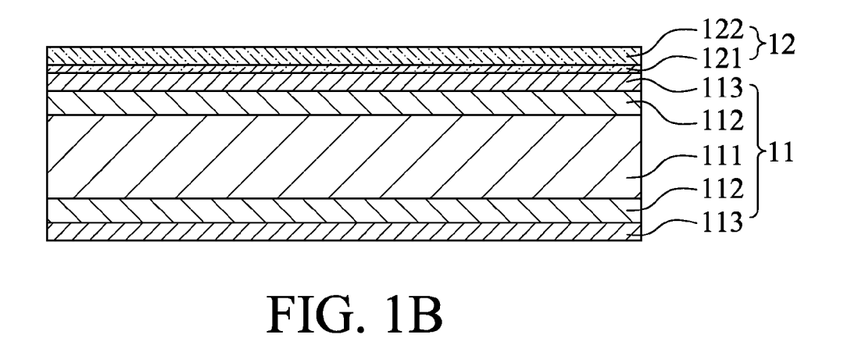
Figure 1C:
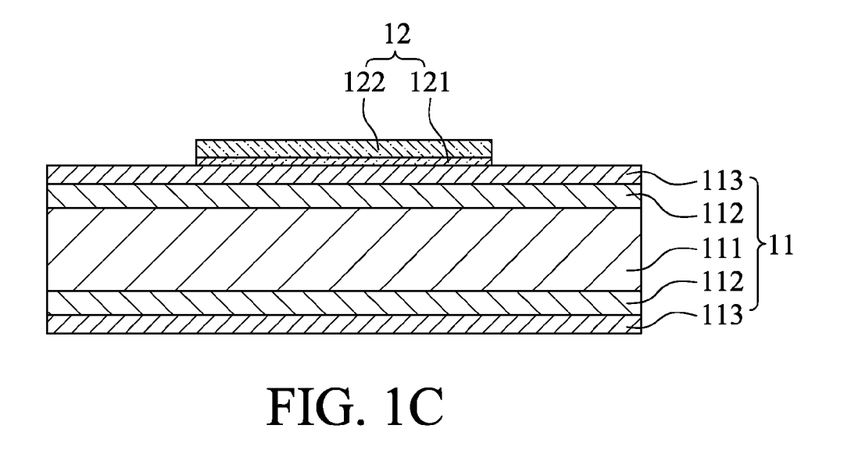
Figure 1D:
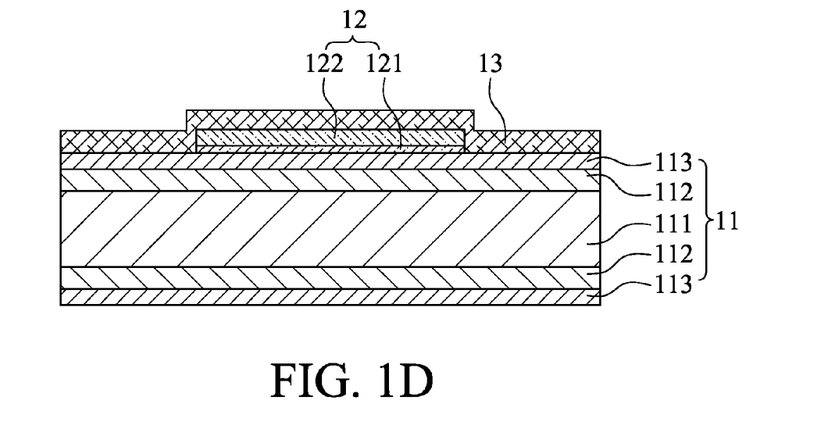
Figure 1E:
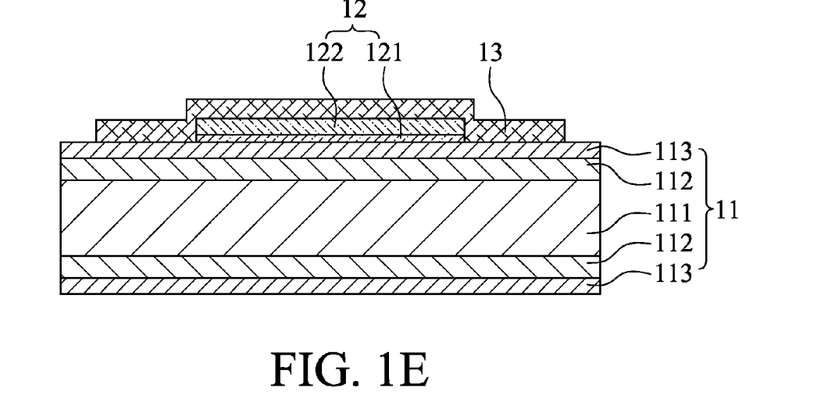
Figure 1F:
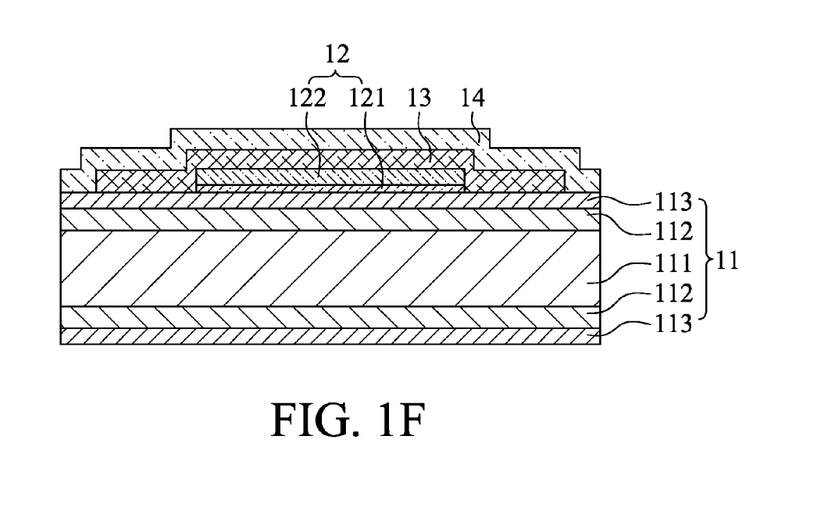
Figure 1G:
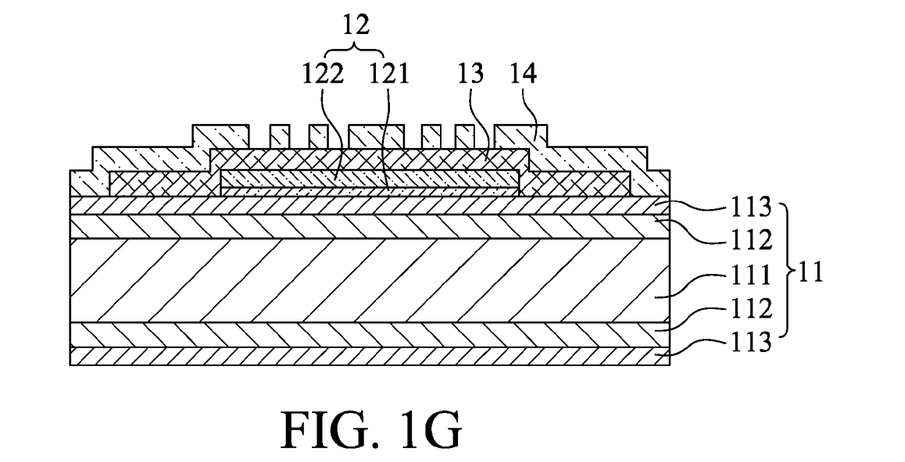
Figure 1H:
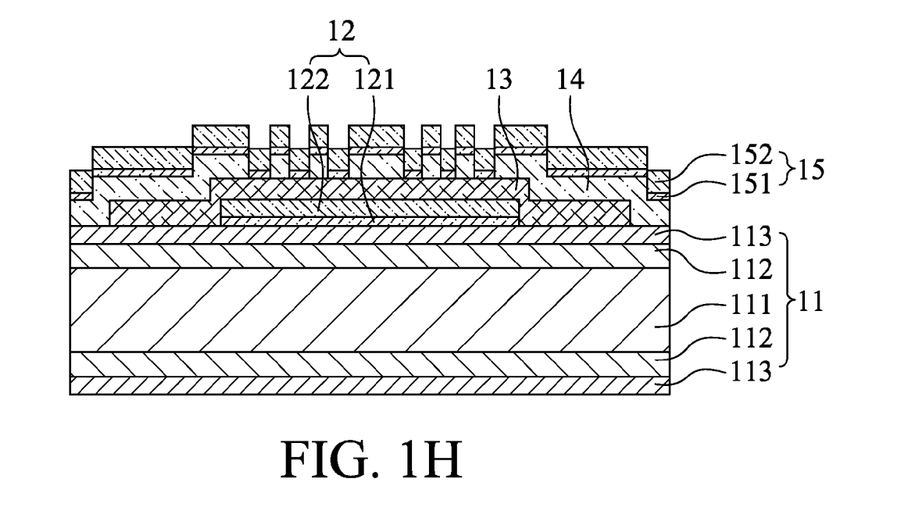
Figure 1I:
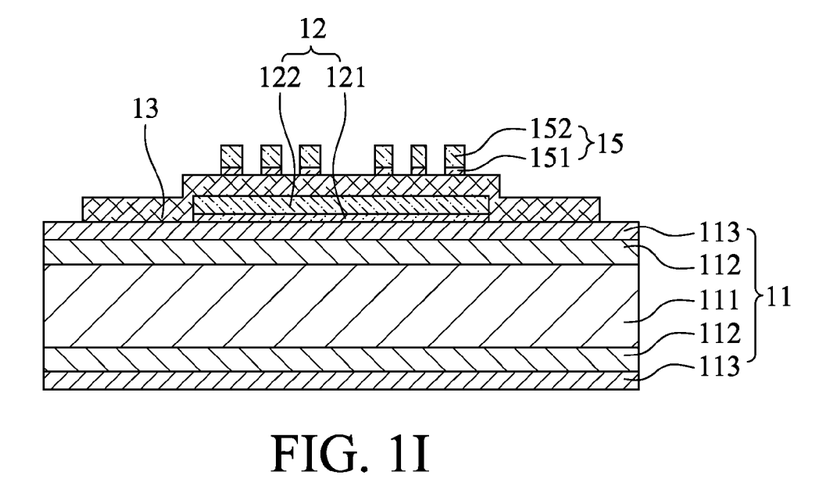
Figure 1J:
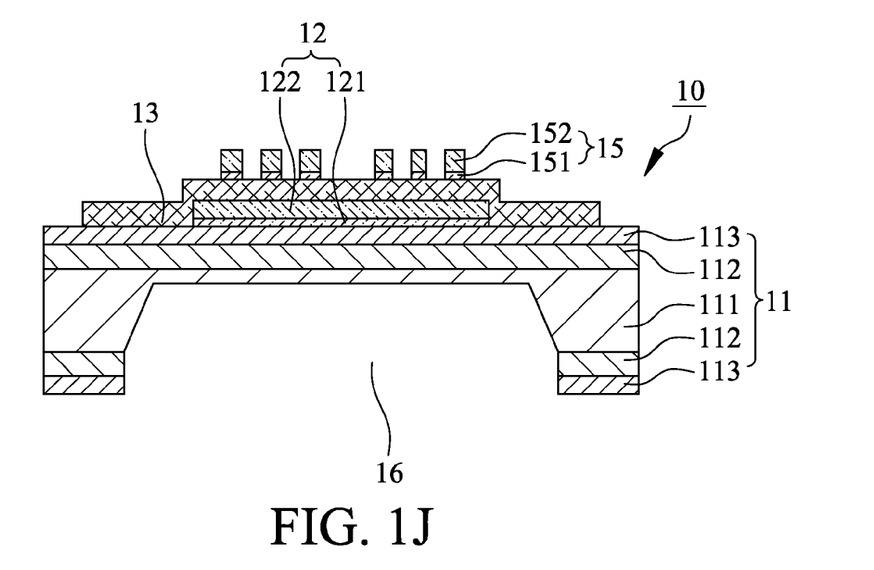

Referring from FIG. 1A to 1J, manufacturing method for a Zinc Oxide piezoelectric thin-film 10 with high C-axis orientation in accordance with an embodiment of this invention comprises the steps of: first, with reference to FIG. 1A, providing a substrate 11 having a base 111, a $SiO_2$ layer 112 and a $Si_3N_4$ layer 113, in this embodiment, the substrate 11 can be a Si substrate; next, with reference to FIG. 1B, forming a bottom electrode layer 12 on the $Si_3N_4$ layer 113 of the substrate 11; with reference to FIG. 1C, patterning the bottom electrode layer 12; with reference to FIG. 1D, sputtering a Zinc Oxide layer 13 on the $Si_3N_4$ layer 113 of the substrate 11 and the bottom electrode layer 12, parameters for sputtering the Zinc Oxide layer 13 include substrate temperature, oxygen/argon ratio, sputtering power and base pressure, wherein the substrate temperature is within the range from 250 to 350 degrees C., the oxygen/argon ratio is within the range from 20% to 25%, the sputtering power is within the range from 150 to 250 watts, the base pressure is within the range from $5 \times 10^{-6}$ to $7 \times 10^{-6}$ Torr; with reference to FIG. 1E, patterning the Zinc Oxide layer 13; then, with reference to FIG. 1F, forming a photoresist layer 14 on the $Si_3N_4$ layer 113 and the Zinc Oxide layer 13, in this embodiment, the photoresist layer 14 can be a photosensitive compound; with reference to FIG. 1G, patterning the photoresist layer 14 to reveal the Zinc Oxide layer 13; next, referring to FIG. 1H, forming a top electrode layer 15 on the Zinc Oxide layer 13 and the photoresist layer 14; with reference to FIG. 1I, removing the photoresist layer 14 and the top electrode layer 15 formed on the photoresist layer 14, and the top electrode layer 15 formed on the Zinc Oxide layer 13 can be remained; eventually, referring to FIG. 1J, patterning the $Si_3N_4$ layer 113 to form a recess 16 that reveals the base 111 of the substrate 11.

Referring again to FIG. 1A, in this embodiment, the thickness of the $SiO_2$ layer 112 is in the range from 3000 to 6000 Å, and the thickness of the $Si_3N_4$ layer 113 is in the range from 1000 to 3000 Å. With reference again to FIG. 1B, the bottom electrode layer 12 comprises a first Cr layer 121 and a first Au layer 122 formed on the first Cr layer 121, wherein the thickness of the first Cr layer 121 is in the range from 100 to 300 Å, and the thickness of the first Au layer 122 is in the range from 1000 to 3000 Å. Referring again to FIG. 1D, in this embodiment, the thickness of the Zinc Oxide layer 13 is in the range from 0.6 to 1.5 um. Referring again to FIG. 1F, the thickness of the photoresist layer 14 is in the range from 3 to 6 um. With reference to FIG. 1H again, the top electrode layer 15 comprises a second Cr layer 151 and a second Au layer 152 formed on the second Cr layer 151, wherein the thickness of the second Cr layer 151 is in the range from 100 to 300 Å, and the thickness of the second Au layer 152 is in the range from 1000 to 3000 Å. Referring again to FIG. 1I, in this embodiment, the step of removing the photoresist layer 14 and the top electrode layer 15 formed on the photoresist layer 14 is implemented by a procedure of lift-off technique. At last, referring to FIG. 1J, the procedure of patterning the $Si_3N_4$ layer 113 is a method of etching to form the recess 16. Besides, the etchant in this embodiment is potassium hydroxide.

Figure 2:
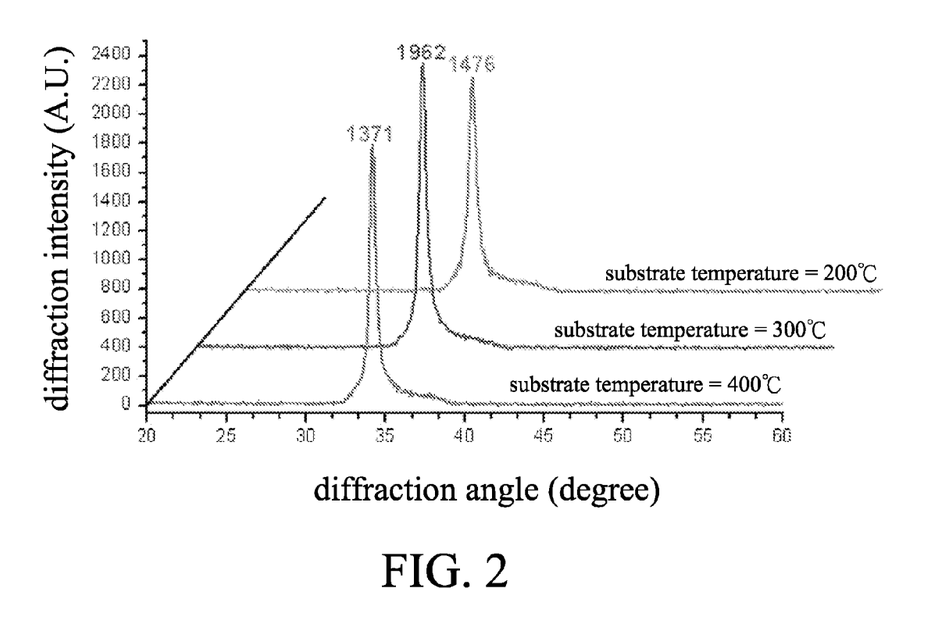
FIG. 2 is a diffraction intensity curve under various substrate temperatures for the Zinc Oxide piezoelectric thin-film with high C-axis orientation in accordance with an embodiment of the present invention.
Figure 3:
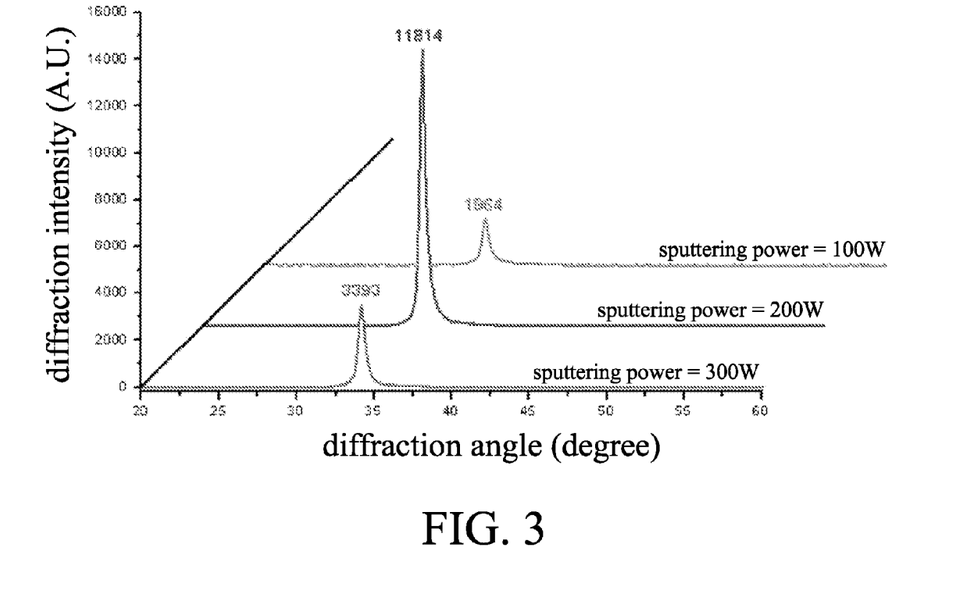
FIG. 3 is a diffraction intensity curve under various sputtering powers for the Zinc Oxide piezoelectric thin-film with high C-axis orientation in accordance with an embodiment of the present invention.
Figure 4:
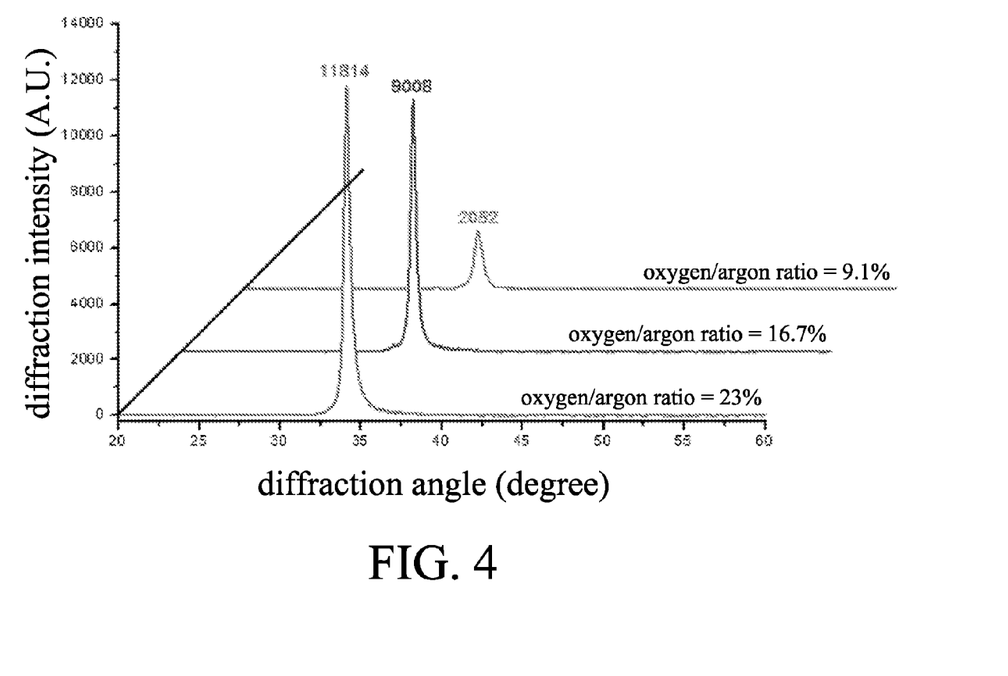
FIG. 4 is a diffraction intensity curve under various oxygen/argon ratios for the Zinc Oxide piezoelectric thin-film with high C-axis orientation in accordance with an embodiment of the present invention.
Figure 5:
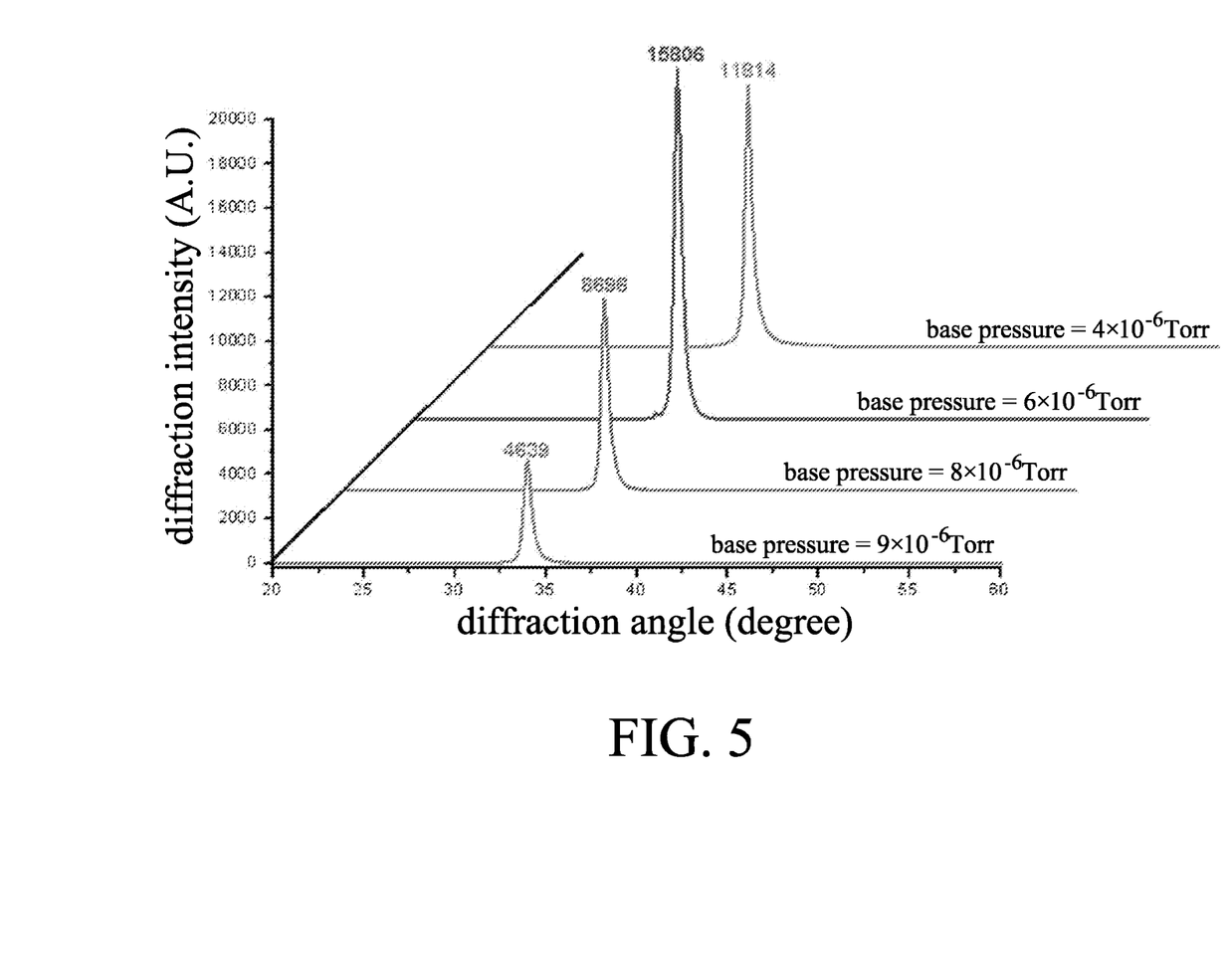
FIG. 5 is a diffraction intensity curve under various base pressures for the Zinc Oxide piezoelectric thin-film with high C-axis orientation in accordance with an embodiment of the present invention.

In this invention, sputtering parameters are important factors to form a high quality Zinc Oxide piezoelectric thin-film. If the substrate temperature becomes too much lower, it might cause insufficient kinetic energy to lead relaxation arrangement of atomic groups. Therefore, an uneven, low density and porous amorphous thin film structure is likely formed via inappropriate low substrate temperature. If the sputtering power rises properly, it might increase the quantity of Zinc atoms attached onto the substrate 11 and the bottom electrode layer 12 to proceed with lattice rearrangement thereby raising thin-film quality. If the oxygen/argon ratio is not enough, the piezoelectric thin-film may generate more lattice defects and heterogeneity phenomenon. If the base pressure is too much higher, the collision between Zinc atoms may increase to generate poor crystalline via energy loss of collided Zinc atoms. On the contrary, if the base pressure is too much lower, the collision between Zinc atoms may reduce to enable Zinc atoms to bombard the surface of the substrate 11 and the bottom electrode layer 12 thereby degrading thin-film quality. Owning to the substrate temperature, the oxygen/argon ratio, the sputtering power and the base pressure are critical sputtering parameters, this invention alters one of the parameters, and the others remain constant to proceed with diffraction intensity measurements. In this embodiment, the diffraction intensity is obtained prior to the step of patterning the $Si_3N_4$ layer 113. Referring to FIG. 2, which is diffraction intensity curve under various substrate temperatures for the Zinc Oxide piezoelectric thin-film 10. This experiment alters the substrate temperature and holds other parameters (oxygen/argon ratio 25%, sputtering power 100 watts and base pressure $4\times10^{-6}$ Torr). From the measurement result, the Zinc Oxide piezoelectric thin-film 10 possesses higher diffraction intensity when the substrate temperature is 300 degrees. Referring to FIG. 3, which is diffraction intensity curve under various sputtering powers for the Zinc Oxide piezoelectric thin-film 10. This experiment alters the sputtering power and holds other parameters (substrate temperature 300 degrees, oxygen/argon ratio 25% and base pressure $4\times10^{-6}$ Torr). From the measurement result, the Zinc Oxide piezoelectric thin-film 10 possesses higher diffraction intensity when the sputtering power is 200 watts. Referring to FIG. 4, which is diffraction intensity curve under various oxygen/argon ratios for the Zinc Oxide piezoelectric thin-film 10. This experiment alters the oxygen/argon ratio and holds other parameters (substrate temperature 300 degrees, sputtering power 200 watts and base pressure $4\times10^{-6}$ Torr). From the measurement result, the Zinc Oxide piezoelectric thin-film 10 possesses higher diffraction intensity when the oxygen/argon ratio is 23%. Referring to FIG. 5, which is diffraction intensity curve under various base pressures for the Zinc Oxide piezoelectric thin-film 10. This experiment alters the base pressure and holds other parameters (substrate temperature 300 degrees, sputtering power 200 watts and oxygen/argon ratio 25%). From the measurement result, the Zinc Oxide piezoelectric thin-film 10 possesses higher diffraction intensity when the base pressure is $6\times10^{-6}$ Torr.

Figure 6:
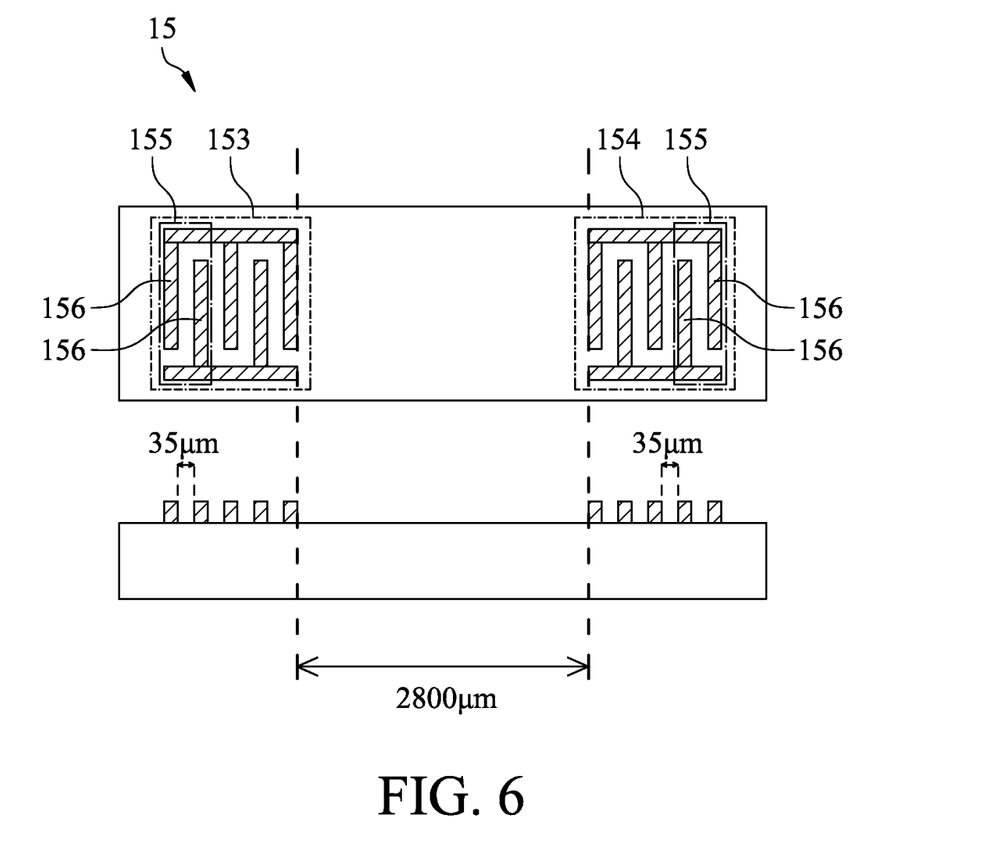
FIG. 6 is a structural drawing of a top electrode layer for the Zinc Oxide piezoelectric thin-film with high C-axis orientation in accordance with an embodiment of the present invention.
Figure 7:
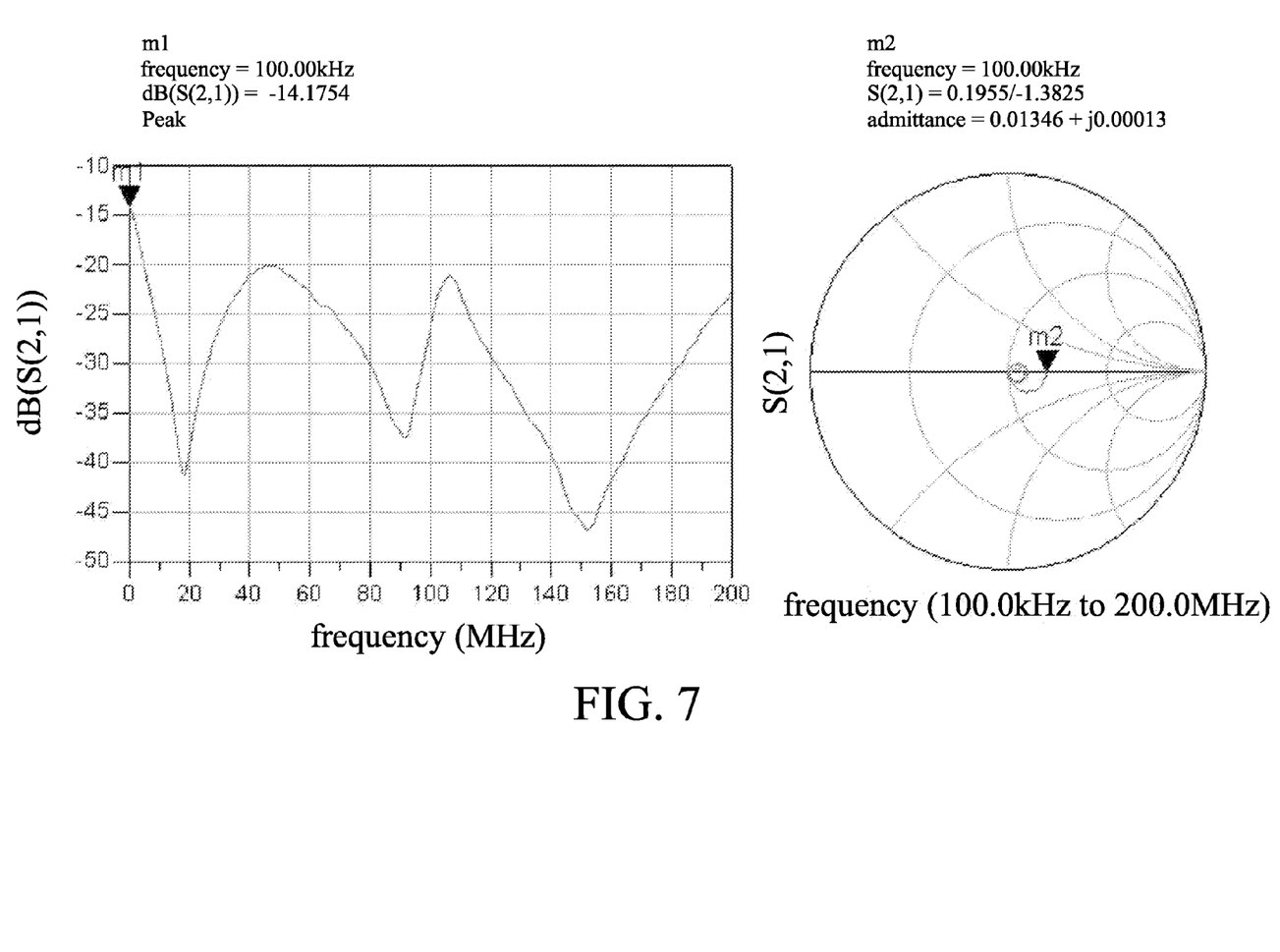
FIG. 7 is a measurement result of the best ZnO piezoelectric thin-film for the Zinc Oxide piezoelectric thin-film with high C-axis orientation in accordance with an embodiment of the present invention.

With reference to FIG. 6, in this embodiment, the top electrode layer 15 further comprises a first inter-digital transducer 153 and a second inter-digital transducer 154 having a plurality of electrode pairs 155 respectively. Preferably, the quantity of the electrode pairs 155 is in the range from 2 to 14 pairs. Each of the electrode pairs 155 comprises two electrodes 156, a gap formed between two electrodes 156 is 35 um, and another gap between each of the adjacent electrode pairs 155 is 35 um. A delay line formed between the first inter-digital transducer 153 and the second inter-digital transducer 154 is in the range from 2500 to 3000 um. A flexural plate wave (FPW) that is being transferred from a voltage signal may be transported from the first inter-digital transducer 153 to the second inter-digital transducer 154. When the quantity of the electrode pairs 155 of the first inter-digital transducer 153 and the second-digital transducer 154 are 7 pairs respectively and the delay line formed between the first inter-digital transducer 153 and the second inter-digital transducer 154 is 2800 um, the transporting flexural plate wave possesses better constructive interference to obtain a better coupling efficiency. In this embodiment, by combining the best sputtering parameters (substrate temperature 300 degrees, sputter power 200 watts, oxygen/argon ratio 25%, base pressure $6\times10^{-6}$ Torr) and best electrode structure (electrode pair 7 pairs, gap 35 um, delay line 2800 um), the electromechanical coupling coefficient of the Zinc Oxide piezoelectric thin-film 10 is higher than 10% as indicated in FIG. 7. In this embodiment, the electromechanical coupling coefficient is obtained after the step of patterning the $Si_3N_4$ layer 113.

Figure 8:
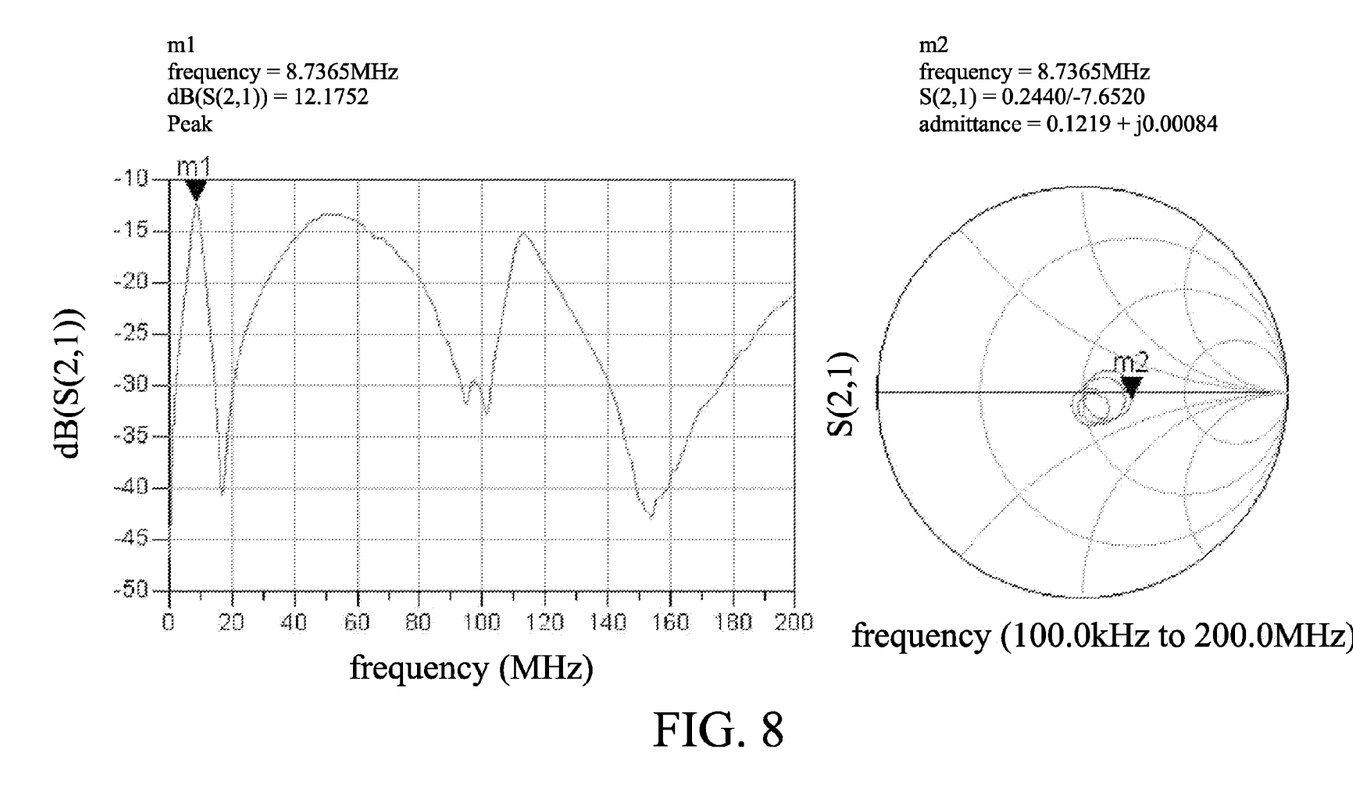
FIG. 8 is a measurement result of sputtering parameters of the first group for the Zinc Oxide piezoelectric thin-film with high C-axis orientation in accordance with an embodiment of the present invention.
Figure 9:
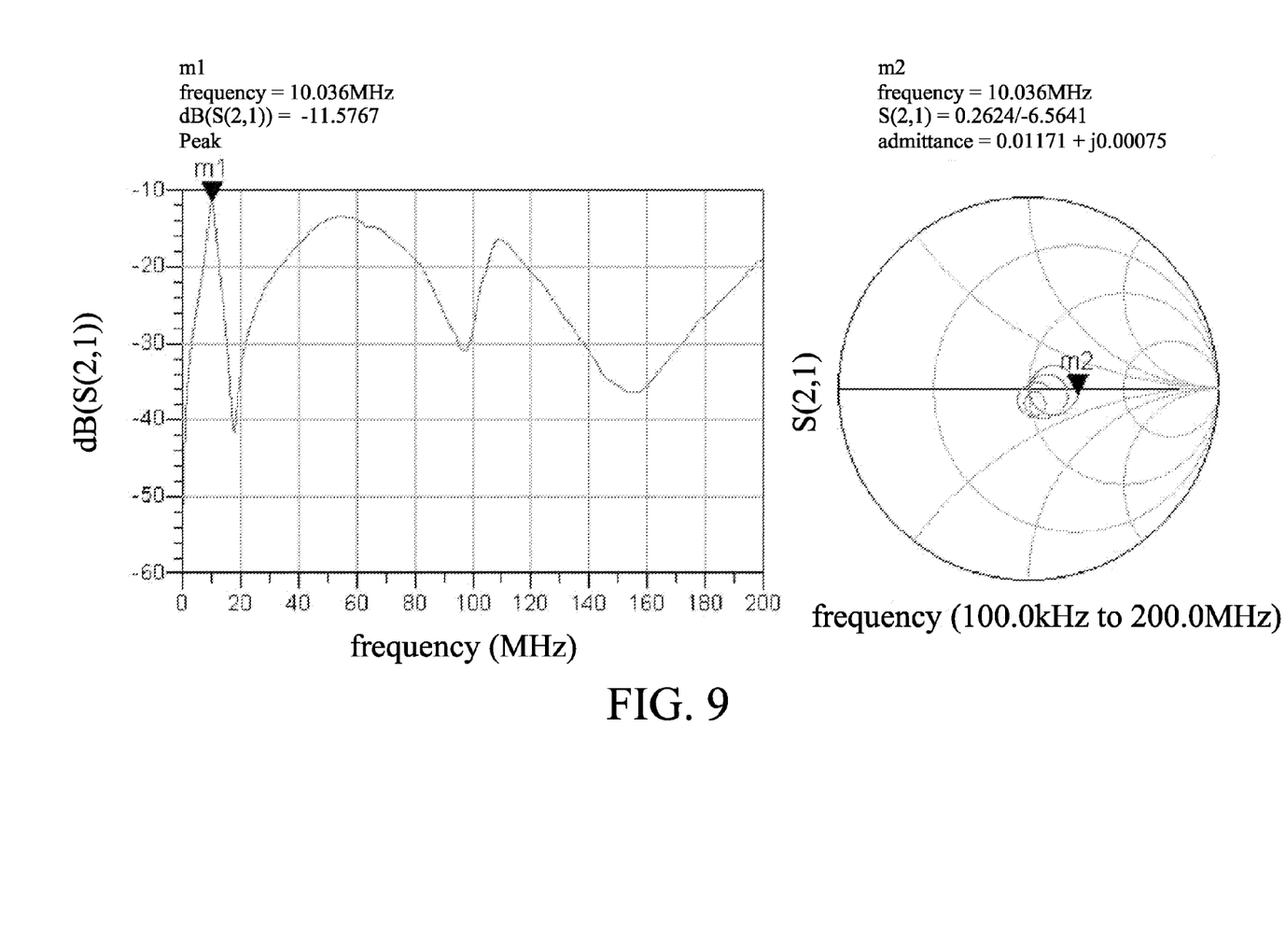
FIG. 9 is a measurement result of sputtering parameters of the second group for the Zinc Oxide piezoelectric thin-film with high C-axis orientation in accordance with an embodiment of the present invention.
Figure 10:
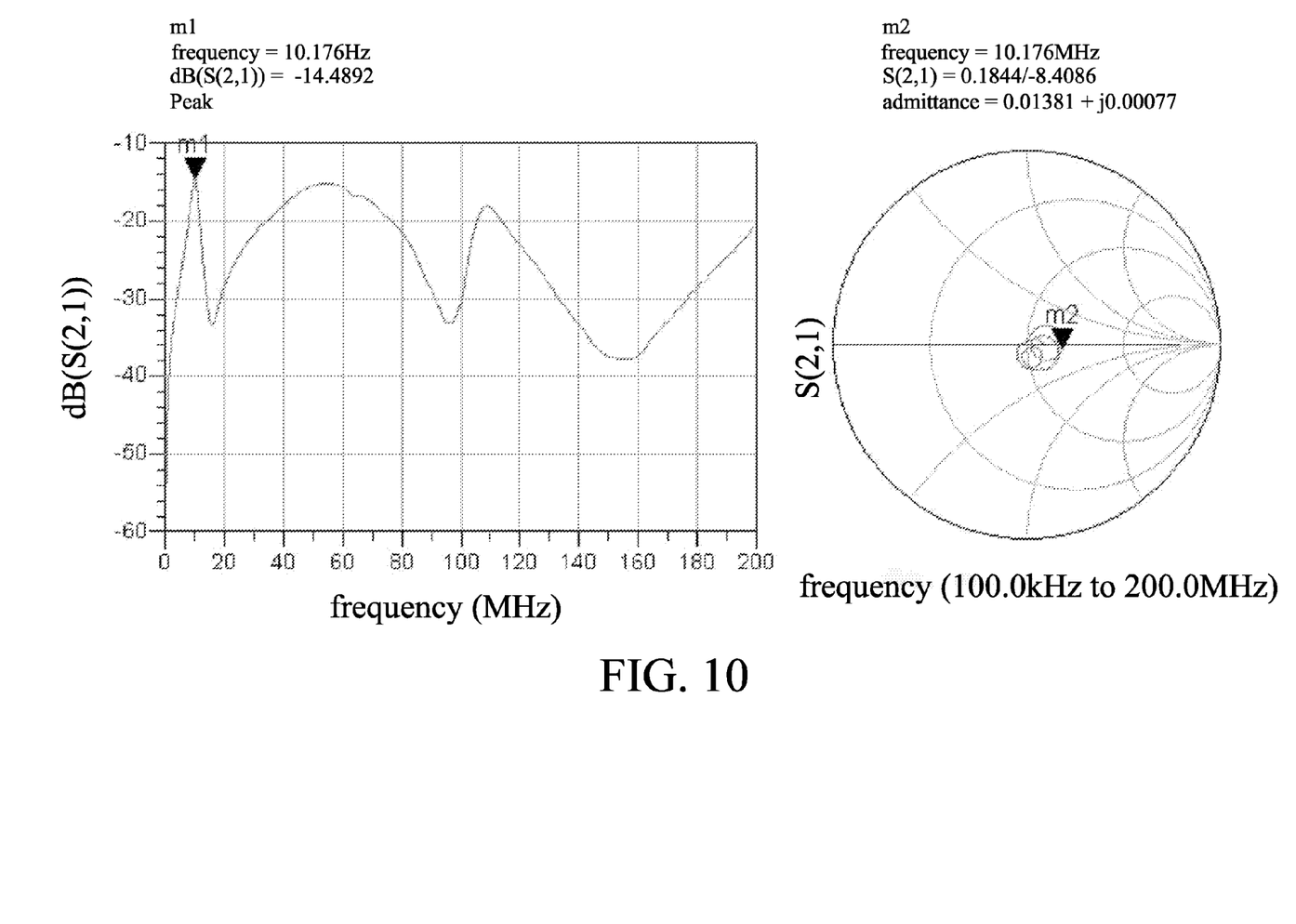
FIG. 10 is a measurement result of sputtering parameters of the third group for the Zinc Oxide piezoelectric thin-film with high C-axis orientation in accordance with an embodiment of the present invention.
Figure 11:
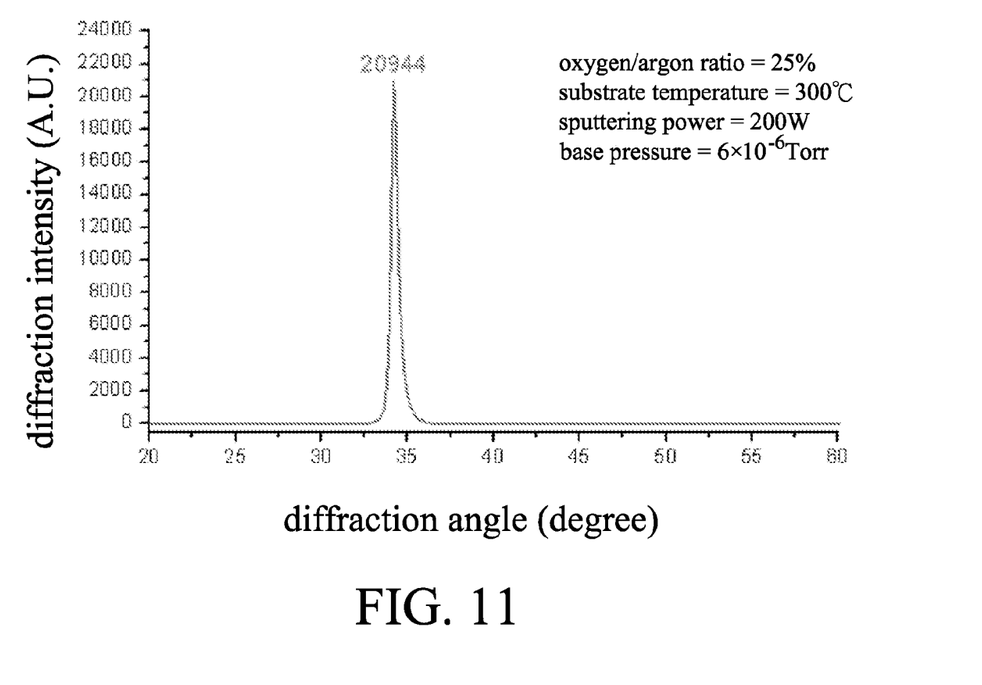
FIG. 11 is a diffraction intensity curve of the best ZnO piezoelectric thin-film for the Zinc Oxide piezoelectric thin-film with high C-axis orientation in accordance with an embodiment of the present invention.

In order to study and discuss the relationship between the diffraction intensity and the electromechanical coupling coefficient, this invention obtained three measurement results of the Zinc Oxide piezoelectric thin-film 10 by applying three different groups of the sputtering parameters. With reference to FIGS. 8, 9 and 10, the three measurement results are corresponded to the diffraction intensities 1785 (A. U.), 11814 (A. U.) and 20944 (A. U.) separately. In this embodiment, mentioned three diffraction intensities are obtained prior to the step of patterning the $Si_3N_4$ layer 113. Referring to FIG. 11, the measurement result of the diffraction intensity 20944 (A. U.) is obtained by combining the best sputtering parameters and the best electrode structure represented the best Zinc Oxide piezoelectric thin-film in this invention. Matching mentioned three measurement results with the Smith Chart to obtain corresponding admittances and inserting the admittances into $K^2 = (\pi/4N) \times (G_a/B)$, wherein K is electromechanical coupling coefficient, N is electrode pair quantity, $G_a$ is conductance, and B is susceptance. The electromechanical coupling coefficients corresponded to three measurement results is 1.628%, 1.877% and 2.012% respectively. Via measurement and calculation results, we realized that the diffraction intensity of the Zinc Oxide piezoelectric thin-film 10 is positively proportional to the electromechanical coupling coefficient. Besides, when the diffraction intensity becomes greater, the Zinc Oxide piezoelectric thin-film 10 is more effective to grow toward the C-axis orientation to result a better piezoelectric effect.

This invention indicates that the diffraction intensity of the Zinc Oxide piezoelectric thin-film 10 is positively proportional to the electromechanical coupling coefficient. Besides, by combining the best sputtering parameters (substrate temperature 300 degrees, sputter power 200 watts, oxygen/argon ratio 25%, base pressure $6 \times 10^{-6}$ Torr) and the best electrode structure (electrode pair 7 pairs, gap 35 um, delay line 2800 um), the Zinc Oxide piezoelectric thin-film 10 not only possesses high C-axis orientation feature, but also effectively raises the electromechanical coupling coefficient higher than 10%. Furthermore, the manufacturing method in this invention is compatible with IC manufacturing process.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A manufacturing method for a Zinc Oxide piezoelectric thin-film with high C-axis orientation comprises the steps of:
    providing a substrate having a base, a $SiO_2$ layer and a $Si_3N_4$ layer;
    forming a bottom electrode layer on the $Si_3N_4$ layer;
    patterning the bottom electrode layer;
    sputtering a Zinc Oxide layer on the $Si_3N_4$ layer and the bottom electrode layer, parameters for sputtering the Zinc Oxide layer include substrate temperature, oxygen/argon ratio, sputtering power and base pressure;
    wherein the substrate temperature is within the range of 250 to 350 degrees C., the oxygen/argon ratio is within the range of 20% to 25%, the sputtering power is within the range of 150 to 250 watts and the base pressure is within the range of 5×10-6 to 7×10-6 Torr;
    patterning the Zinc Oxide layer;
    forming a photoresist layer on the Zinc Oxide layer and the $Si_3N_4$ layer;
    patterning the photoresist layer to reveal the Zinc Oxide layer;
    forming a top electrode layer on the Zinc Oxide layer and the photoresist layer;
    removing a portion of the photoresist layer and a portion of the top electrode layer formed on the photoresist layer, and another portion of the top electrode layer formed on the Zinc Oxide layer can be remained; and
    patterning the $Si_3N_4$ layer to form a recess that reveals the base of the substrate.

2. The manufacturing method for a Zinc Oxide piezoelectric thin-film with high C-axis orientation in accordance with claim 1,
    wherein the thickness of the $SiO_2$ layer is in the range from 3000 to 6000 Å.

3. The manufacturing method for a Zinc Oxide piezoelectric thin-film with high C-axis orientation in accordance with claim 1,
    wherein the thickness of the $Si_3N_4$ layer is in the range from 1000 to 3000 Å.

4. The manufacturing method for a Zinc Oxide piezoelectric thin-film with high C-axis orientation in accordance with claim 1,
    wherein the bottom electrode layer comprises a first Cr layer and a first Au layer formed on the first Cr layer.

5. The manufacturing method for a Zinc Oxide piezoelectric thin-film with high C-axis orientation in accordance with claim 1,
    wherein the top electrode layer comprises a second Cr layer and a second Au layer formed on the second Cr layer.

6. The manufacturing method for a Zinc Oxide piezoelectric thin-film with high C-axis orientation in accordance with claim 4,
    wherein the thickness of the first Cr layer is in the range from 100 to 300 Å, the thickness of the first Au layer is in the range from 1000 to 3000 Å.

7. The manufacturing method for a Zinc Oxide piezoelectric thin-film with high C-axis orientation in accordance with claim 5,
    wherein the thickness of the second Cr layer is in the range of 100 to 300 Å, the thickness of the second Au layer is in the range from 1000 to 3000 Å.

8. The manufacturing method for a Zinc Oxide piezoelectric thin-film with high C-axis orientation in accordance with claim 1,
    wherein the thickness of the Zinc Oxide layer is in the range from 0.6 to 1.5 um.

9. The manufacturing method for a Zinc Oxide piezoelectric thin-film with high C-axis orientation in accordance with claim 1,
    wherein the step of removing the photoresist layer and the top electrode layer formed on the photoresist layer is implemented by a procedure of lift-off technique.

10. The manufacturing method for a Zinc Oxide piezoelectric thin-film with high C-axis orientation in accordance with claim 1,
    wherein the photoresist layer can be a photosensitive compound.

11. The manufacturing method for a Zinc Oxide piezoelectric thin-film with high C-axis orientation in accordance with claim 1,
    wherein the top electrode layer further comprises a first inter-digital electrode and a second inter-digital electrode having a plurality of electrode pairs respectively, and a delay line formed between the first inter-digital electrode and the second inter-digital electrode is in the range from 2500 to 3000 um.

12. The manufacturing method for a Zinc Oxide piezoelectric thin-film with high C-axis orientation in accordance with claim 11,
    wherein the quantity of electrode pairs of the first inter-digital electrode and the second inter-digital electrode is in the range from 2 to 14 pairs, each of the electrode pairs has two electrodes, and a gap between two electrodes is 35 um.

* * * * *